(12) United States Patent
Yim et al.

(10) Patent No.: US 10,714,194 B2
(45) Date of Patent: *Jul. 14, 2020

(54) MEMORY SYSTEM INCLUDING A MEMORY DEVICE, AND METHODS OF OPERATING THE MEMORY SYSTEM AND MEMORY DEVICE

(71) Applicant: SAMSUNG ELECTRONICS CO., LTD., Suwon-si, Gyeonggi-Do (KR)

(72) Inventors: Hye-Jin Yim, Wonju-si (KR); Sang-Yong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,568

(22) Filed: Jan. 15, 2019

(65) Prior Publication Data

US 2019/0147965 A1    May 16, 2019

Related U.S. Application Data

(60) Continuation of application No. 15/639,234, filed on Jun. 30, 2017, now Pat. No. 10,217,517, which is a (Continued)

(30) Foreign Application Priority Data

Aug. 14, 2013  (KR) .................. 10-2013-0096894

(51) Int. Cl.
*G11C 29/00* (2006.01)
*G11C 16/34* (2006.01)
(Continued)

(52) U.S. Cl.
CPC ........ *G11C 16/3422* (2013.01); *G06F 11/073* (2013.01); *G06F 11/079* (2013.01);
(Continued)

(58) Field of Classification Search
CPC ..... G11C 16/3422; G11C 16/10; G11C 16/26; G11C 16/3418; G11C 16/3431;
(Continued)

(56) References Cited

U.S. PATENT DOCUMENTS 4,942,576 A   7/1990  Busack et al.
6,067,262 A   5/2000  Irrinki et al.
(Continued)

FOREIGN PATENT DOCUMENTS

KR   1020090000463 A   1/2009
KR   1020100124892 A   11/2010
(Continued)

OTHER PUBLICATIONS

Korean Office Action dated Sep. 26, 2019 Cited in Korean Application No. 10-2013-0096894.
(Continued)

*Primary Examiner* — Christine T. Tu
(74) *Attorney, Agent, or Firm* — Volentine, Whitt & Francos, PLLC

(57) ABSTRACT

A method is provided for operating a memory device. The method includes counting, from among memory cells, a number of first off-cells with respect to a first reading voltage and a number of second off-cells with respect to a second reading voltage, comparing the number of first off-cells and the number of second off-cells, and determining, based on a result of the comparing, whether a programming error exists in a storage region in which the memory cells are included.

20 Claims, 15 Drawing Sheets

Related U.S. Application Data division of application No. 14/456,572, filed on Aug. 11, 2014, now Pat. No. 9,728,279.

(51) Int. Cl.
| | |
|---|---|
| *G11C 29/52* | (2006.01) |
| *G11C 29/42* | (2006.01) |
| *G06F 11/07* | (2006.01) |
| *G11C 16/10* | (2006.01) |
| *G11C 16/26* | (2006.01) |

(52) U.S. Cl.
CPC .......... *G06F 11/0751* (2013.01); *G11C 16/10* (2013.01); *G11C 16/26* (2013.01); *G11C 16/3418* (2013.01); *G11C 16/3431* (2013.01); *G11C 29/42* (2013.01); *G11C 29/52* (2013.01)

(58) Field of Classification Search
CPC ....... G11C 29/52; G11C 29/42; G06F 11/073; G06F 11/0751; G06F 11/079; G06F 11/1076

See application file for complete search history.

(56) References Cited

U.S. PATENT DOCUMENTS

| | | | |
|---|---|---|---|
| 6,219,280 B1 | 4/2001 | Naganawa | |
| 6,438,035 B2 | 8/2002 | Yamamoto et al. | |
| 6,549,457 B1 | 4/2003 | Srinivasan et al. | |
| 7,669,004 B2 | 2/2010 | Lin et al. | |
| 7,904,635 B2 | 3/2011 | Deng et al. | |
| 7,936,601 B2 | 5/2011 | Kang et al. | |
| 8,027,194 B2 | 9/2011 | Lee et al. | |
| 8,159,892 B2 | 4/2012 | Kang | |
| 8,218,371 B2 | 7/2012 | Byeon | |
| 8,345,487 B2 | 1/2013 | Kim et al. | |
| 8,767,475 B2 | 7/2014 | Cho et al. | |
| 9,638,602 B2 | 5/2017 | Gibson et al. | |
| 9,728,279 B2 | 8/2017 | Yim et al. | |
| 2001/0052093 A1 | 12/2001 | Oshima et al. | |
| 2009/0013231 A1 | 1/2009 | Lam | |
| 2012/0008401 A1 | 1/2012 | Katz et al. | |
| 2012/0155168 A1 | 6/2012 | Kim et al. | |
| 2016/0093387 A1* | 3/2016 | Oh | G11C 16/16 365/185.11 |
| 2019/0235954 A1* | 8/2019 | Gim | G11C 29/021 |
| 2019/0286442 A1* | 9/2019 | Takizawa | G11C 7/04 |

FOREIGN PATENT DOCUMENTS

| | | |
|---|---|---|
| KR | 1020120138566 | 12/2012 |
| KR | 101821604 B1 | 2/2013 |
| KR | 1020130034830 A | 4/2013 |

OTHER PUBLICATIONS

Korean Notice of Allowance dated Feb. 28, 2020 Corresponding to Korean Application No. KR 10-2013-0096894.

* cited by examiner

MEMORY SYSTEM INCLUDING A MEMORY DEVICE, AND METHODS OF OPERATING THE MEMORY SYSTEM AND MEMORY DEVICE

CROSS-REFERENCE TO RELATED APPLICATIONS

This is a Continuation of U.S. patent application Ser. No. 15/639,234, filed Jun. 30, 2017, which is a Divisional of U.S. patent application Ser. No. 14/456,572, filed Aug. 11, 2014, in which a claim for priority under 35 U.S.C. § 119 is made to Korean Patent Application No. 10-2013-0096894, filed on Aug. 14, 2013, in the Korean Intellectual Property Office, the entire contents of which are hereby incorporated by reference.

BACKGROUND

Embodiments of the inventive concept relate to methods of operating a memory device and methods of operating a memory system, and more particularly, to methods of operating a memory device whereby a programming error of the memory device may be detected, and methods of operating a memory system using the method of operating the memory device.

Generally, it is desirable for a memory device to provide reliable storage of data. To this end, after writing data to a memory cell, it may be determined whether the data has been accurately written. Also, when reading data, an error correction method, such as an error check and correction (ECC), may be performed to correct data including an error.

SUMMARY

Embodiments of the inventive concept provide a memory device and methods of operating a memory device including determining whether programming of a memory cell in the memory device is performed normally, and a memory system and methods of operating a memory system in order to enable the memory device to stably operate.

According to an aspect of the inventive concept, there is provided a method of operating a memory device. The method includes counting, from among memory cells, a number of first off-cells with respect to a first reading voltage and a number of second off-cells with respect to a second reading voltage; comparing the number of first off-cells and the number of second off-cells; and determining, based on a result of the comparing, whether a programming error exists in a storage region in which the memory cells are included.

A voltage level of the first reading voltage may be higher than a voltage level of the second reading voltage.

The first reading voltage may correspond to a highest state from among multiple states in which the memory cells are programmed. The second reading voltage may correspond to a second highest state from among the states in which the memory cells are programmed.

The first reading voltage and the second reading voltage may respectively correspond to a first state and a second state from among multiple states in which the memory cells are programmed. The first state may be a state in which a memory cell is programmed last, and the second state may be a state to which a memory cell is programmed before the first state.

The method may further include reprogramming the memory cells when it is determined that a programming error exists.

Comparing the numbers of first and second off-cells may include calculating a ratio of the number of second off-cells with respect to the second reading voltage to the number of first off-cells with respect to the first reading voltage.

Comparing the numbers of first and second off-cells may include calculating numbers of memory cells in which a reading error is generated with respect to a first state corresponding to the first reading voltage and a second state corresponding to the second reading voltage, respectively; and comparing reading error generation amounts of the first state and the second state.

Determining whether a programming error exists may include determining that a sudden power-off has occurred during an operation of programming the memory cells when the programming error is detected.

The memory cells may include multi-bit memory cells.

According to another aspect of the inventive concept, there is provided a method of operating a memory system. The method includes supplying power to a memory device comprising memory cells, detecting whether a programming error exists with respect to data programmed in a storage region of the memory device, and reprogramming the programmed data when a programming error is detected. Detecting whether a programming error exists is performed based on a result of comparing counted numbers of memory cells included in two states from among multiple states in which the memory cells are programmed.

The programmed data may be reprogrammed in a region different from the storage region.

The method may further include treating the storage region as a fail region when programming error is detected in the storage region.

The storage region may be a region which is accessed and programmed last before power to the memory device is interrupted.

The memory device may include a flash memory.

According to another aspect of the inventive concept, there is provided a memory system including a memory device having a memory cell array including memory cells arranged in storage regions; a memory controller configured to perform control operations with respect to the memory device, including programming and reading data; and a programming error detector configured to determine whether a programming error exists with respect to a memory cell in a storage region. The programming error detector includes an off-cell counter, a comparator, and a programming error determiner. The off-cell counter is configured to receive first data and second data, and to count a number of first off-cells with respect to a first reading voltage corresponding to a first state and a number of second off-cells with respect to a second reading voltage corresponding to a second state, where the first data indicates respective states of memory cells read based on the first reading voltage and the second data indicates respective states of memory cells read based on the second reading voltage. The comparator is configured to compare the number of first off-cells and the number of second off-cells, or to compare a variation of the number of first off-cells and a variation of the number of second off-cells, and to determine a comparison result. The programming error determiner is configured to determine whether the storage region includes a programming error based on the comparison result.

When the comparator compares the number of first off-cells and the number of second off-cells, the comparing may include calculating a ratio of the number of second off-cells to the number of first off-cells to determine the comparison result. The programming error determiner may be configured to determine that the storage region includes a programming error when the comparison result is less than a predetermined determination reference value.

When the comparator compares the variation of the number of first off-cells and the variation of the number of second off-cells, the comparing may include calculating a ratio of the variation of the number of first off-cells to the variation of the number of second off-cells to determine the comparison result. The programming error determiner may be configured to determine that the storage region includes a programming error when the comparison result is greater than a predetermined determination reference value.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

Figure 1:
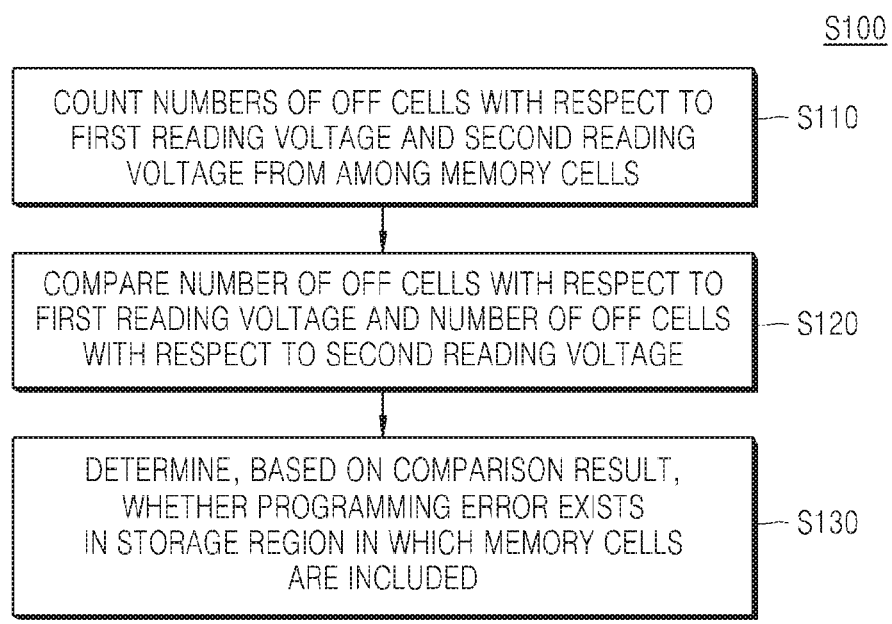
FIG. 1 is a flowchart illustrating a method of operating a memory device, according to an embodiment of the inventive concept.

Embodiments will be described in particular with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may be repeated. In the drawings, sizes and relative sizes of layers and regions may be exaggerated for clarity.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, the term "exemplary" refers to an example or illustration.

Unless defined differently, terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Expressions such as "at least one of," when preceding a list of elements, modify the entire list of elements and do not modify the individual elements of the list.

When a programming operation is performed on a memory cell to store data in a flash memory, for example, each memory cell has a programming state. Generally, states of memory cells may indicate predetermined bits or data, and a threshold voltage distribution of memory cells is formed to correspond to each state. When memory cells are normally programmed, a threshold voltage distribution of the memory cells may have a Gaussian distribution. However, when a normal programming operation is hindered, for example, by a sudden power-off state that occurs during a programming operation, memory cells may not be programmed to corresponding target states, and an abnormal threshold voltage distribution of the memory cells may be formed. Accordingly, a reading error where another state is read instead of a targeted state of programming of multiple memory cells may be generated when reading states of the memory cells. In addition, a threshold voltage distribution of the memory cells may deteriorate with time, increasing the number of memory cells in which reading error is generated. Therefore, whether memory cells that are programmed in a memory device are normally programmed is to be checked, and when the memory cells are abnormally programmed, a reprogramming operation is needed to more stably and reliably store data.

Figure 2A:
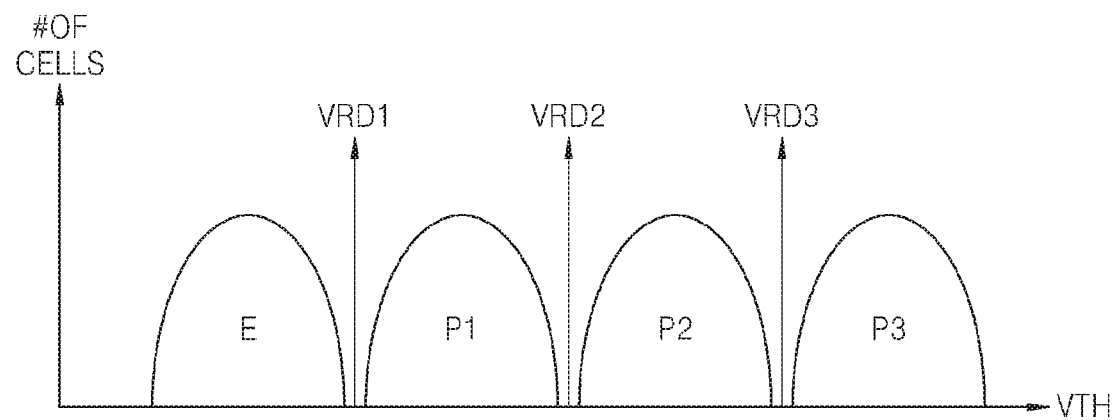
FIG. 2A is a graph showing a threshold voltage distribution of a normally programmed memory cell.
Figure 2B:
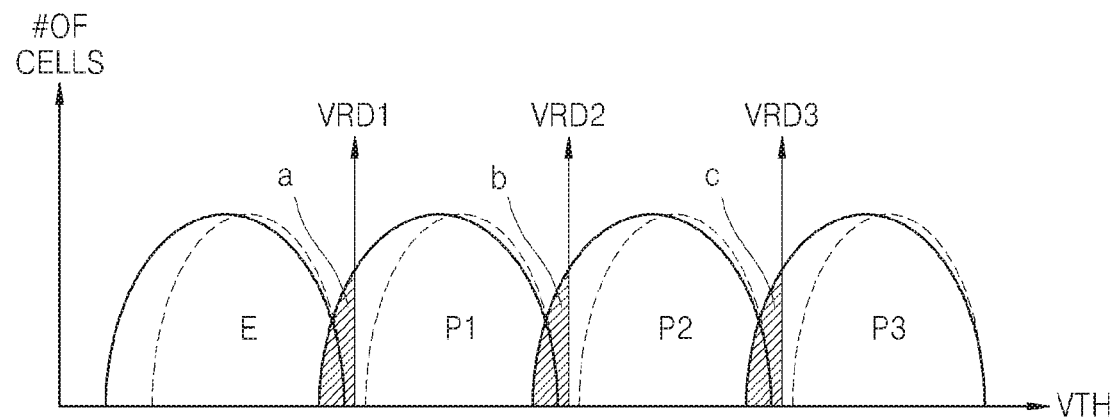
FIG. 2B is a graph showing a threshold voltage distribution of a deteriorated memory cell.
Figure 2C:
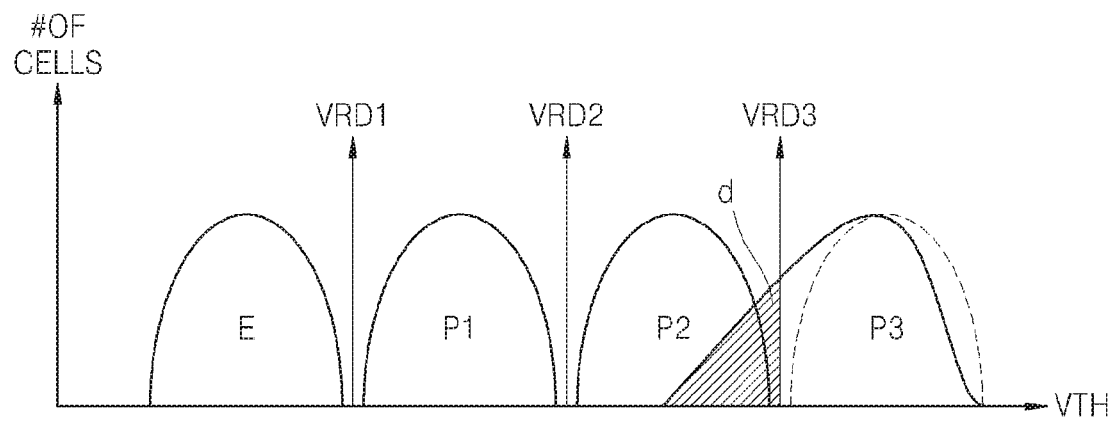
FIG. 2C is a graph showing a threshold voltage distribution of a memory cell when a sudden power-off state has occurred during a programming operation.

A method of operating a memory device, according to an embodiment of the inventive concept, will be described with reference to FIGS. 1 and 2A through 2C. FIG. 1 is a flowchart illustrating a method of operating a memory device, according to an embodiment of the inventive concept. FIG. 2A is a graph showing a threshold voltage distribution of normally programmed memory cells. FIG. 2B is a graph showing a threshold voltage distribution of normally programmed, deteriorated memory cells. FIG. 2C is a graph showing a threshold voltage distribution of abnormally programmed memory cells.

The method of operating a memory device illustrated in FIG. 1 may be performed in a non-volatile memory device, such as a flash memory device, a phase change random access memory (PRAM) using a phase-change material, a resistance random access memory (RRAM) using a variable resistance material, such as a transition metal oxide, or a magnetic random access memory (MRAM) using a ferromagnetic material, for example. Hereinafter, it will be assumed for purposes of illustration that the method is performed in a flash memory device, including multi-level cells that store data of at least two bits in each memory cell. A detailed structure of an illustrative memory cell array included in a flash memory device and of an illustrative structure of a memory cell are described later with reference to FIG. 5A, FIG. 5B and FIG. 6. Of course, other types of memory devices may be incorporated without departing from the scope of the present teachings.

Referring to FIG. 1, the method of operating a memory device according to an embodiment of the inventive concept includes counting, from among memory cells in a storage region, the number of off-cells with respect to a first reading voltage and the number of off-cells with respect to a second reading voltage (S110). The method further includes comparing the number of off-cells at the first reading voltage and the number of off-cells at the second reading voltage (S120), and determining, based on a result of the comparing, whether a programming error exists in the storage region in which the memory cells are included (S130), e.g., depending on whether a programming operation with respect to the storage area is performed normally or abnormally. In particular, the method of operating the memory device according to the depicted embodiment particularly relates to a method of detecting a programming error when programming with respect to memory cells is performed abnormally. The number of off-cells with respect to a reading voltage refers to the number of memory cells with a threshold voltage higher than the reading voltage.

Referring to FIG. 2A, the threshold voltage distribution of normally programmed memory cells is shown. In FIG. 2B, the threshold voltage distribution of the normally programmed, deteriorated memory cells exhibits different aspects from the threshold voltage distribution depicted in FIG. 2A. In FIG. 2C, the threshold voltage distribution of the abnormally programmed memory cells is significantly different from the threshold voltage distributions of both the normally programmed memory cells (FIG. 2A) and the normally programmed memory cells that subsequently deteriorate (FIG. 2B).

First, referring to FIGS. 2A through 2C, a memory cell may be programmed to one of multiple states. For example, when a memory cell is a 2-bit multi-level memory cell, the memory cell may be programmed to one of states E, P1, P2 and P3, as illustrated in FIGS. 2A through 2C. Each state indicates a logic value of data stored in the memory cell. For example, state E may indicate logic data "11", state P1 may indicate logic data "10," state P2 may indicate logic data "00," and state P3 may indicate logic data "01." The states of the memory cell may be classified according to reading voltages VRD1, VRD2, and VRD3. For example, a memory cell may be read in state P3 when the threshold voltage of the memory cell is equal to or greater than the reading voltage VRD3, may be read in state P2 when the threshold voltage of the memory cell is less than the reading voltage VRD3 and equal to or greater than the reading voltage VRD2, may be read in state P1 when the threshold voltage of the memory cell is less than the reading voltage VRD2 and equal to or greater than the reading voltage VRD1, or may be read as state E when the threshold voltage of the memory cell is lower than the reading voltage VRD1.

Meanwhile, an off-cell with respect to a reading voltage refers to a memory cell having a threshold voltage that is equal to or greater than the particular reading voltage. For example, in FIG. 2A, an off-cell with respect to the reading voltage VRD3 is in state P3, and an off-cell with respect to the reading voltage VRD2 is in state P2 or state P3. Likewise, an off-cell with respect to the reading voltage VRD1 is in state P1, P2, or P3. When a threshold voltage of a memory cell decreases and becomes lower than a reading voltage corresponding to the state to which the memory cell is programmed, the number of off-cells with respect to the reading voltage may decrease. In this case, a reading error occurs when a reading operation is conducted.

Referring further to FIG. 2A, when memory cells are normally programmed, the threshold voltage distribution thereof forms a Gaussian curve for each state (states E, P1, P2, and P3). Also, each state may be classified as multiple reading voltages VRD1, VRD2, and VRD3.

When memory cells deteriorate after being normally programmed, the width of the threshold voltage distribution of the memory cells increases in each state, as shown in FIG. 2B, for example. Accordingly, although the threshold voltages of some memory cells of in certain states becomes lower than the corresponding reading voltage VRD1, VRD2, or VRD3, the threshold voltage distributions of the respective states still form a Gaussian distribution, and widths of the threshold voltage distributions of the states are similar.

However, the threshold voltage distribution of memory cells that are abnormally programmed is different from that of normally programmed memory cells or memory cells that deteriorate after being programmed normally. When memory cells are abnormally programmed, the width of the threshold voltage distribution of memory cells in a predetermined state of the multiple states may be significantly greater than the widths of the threshold voltage distributions in other states, as shown in FIG. 2C, for example. Referring to FIG. 2C, the threshold voltage distribution of states E, P1, and P2 is similar to that of normally programmed memory cells, but the width of the threshold voltage distribution of state P3 is greater than that of the threshold voltage distribution of the normally programmed memory cell in state P3. Thus, the width of the threshold voltage distribution of state P3 is greater than that of the threshold voltage distribution of states E, P1, and P2. This is because programming in state P3 has not been normally performed due to some unexpected occurrence, such as a sudden power-off, for example. Generally speaking, when programming is performed abnormally, the threshold voltage distribution of memory cells that are programmed in a predetermined state, from among multiple states in which memory cells may be programmed, may be poorer than that of other memory cells programmed in different states from this predetermined state.

Accordingly, a variation in a reduction of off-cells (hereinafter referred to as a variation or reduction in the number of off-cells) may be calculated by counting the number of off-cells with respect to each of the reading voltages and comparing the counted number of off-cells to a predicted value of the number of off-cells with respect to the reading voltages, respectively. A reduction in the number of off-cells with respect to a predetermined voltage may be significantly greater than that of the number of off-cells with respect to other threshold voltages. The predicted value of the number of off-cells with respect to the reading voltages is calculated based on the number of programming states with respect to the number of memory cells or stored information of the number of memory cells programmed to respective states when programming is performed to the memory cells.

Referring to FIGS. 2A and 2B, distribution characteristics of the respective states are similar. It may therefore be estimated that there is not a significant difference between a reduction in the number of off-cells with respect to the reading voltage VRD3 and a reduction in the number of off-cells with respect to the reading voltages VRD2 and VRD1, respectively. However, referring to FIG. 2C, it may be estimated that a reduction in the number of off-cells with respect to the reading voltage VRD3 is significantly different from a reduction in the number of off-cells with respect to the reading voltage VRD2, for example.

As described above, when a memory cell is abnormally programmed, as compared to the case of a memory cell being normally programmed, a reduction in the number of off-cells with respect to a predetermined reading voltage is greater than that of the number of off-cells with respect to other threshold voltages. Thus, whether programming has been abnormally conducted, that is, whether a programming error exists, may be detected by counting the number of off-cells with respect to threshold voltages (reflecting the above characteristics) and comparing the numbers.

A method of detecting a programming error, according to the current embodiment, will be described in more detail with reference to FIG. 1 and FIGS. 2A through 2C.

First, in operation S110, the number of off-cells with respect to a first reading voltage and a second reading voltage, respectively, are counted from among memory cells. The first reading voltage and the second reading voltage are voltages among a plurality of voltages used in reading programmed memory cells. For example, the first reading voltage may have the highest voltage level (e.g., VRD3), and the second reading voltage may have a lower voltage level than the first reading voltage (e.g., VRD2, VRD1) and possibly other reading voltages. Off-cells with respect to the first reading voltage may refer to memory cells having threshold voltages higher than the first reading voltage, and off-cells with respect to the second reading voltage may refer to memory cells having threshold voltages higher than the second reading voltage. The first reading voltage may be a reading voltage corresponding to a first state from among states in which memory cells are programmed, and the second reading voltage may be a reading voltage corresponding to a second state. For example, the first state may be the last state in which a memory cell is programmed, and the second state may be the state programmed before the first state. When programming a memory cell by increasing a threshold voltage of the memory cell in a stepwise manner, the first state may be a state in which the threshold voltage of a memory cell is the highest, that is, the highest state, and the second state may be a state in which the threshold voltage of a memory cell is second to the highest state, that is, the second highest state. However, the first and second states described herein are exemplary and are not limited thereto. The first and second states may be determined in various manners, for example, in an order according to which respective states are programmed or according to types of memory cells. The relationship between the first reading voltage and the second reading voltage may also vary accordingly.

For example, referring to FIGS. 2A through 2C, the first reading voltage may be the reading voltage VRD3, and the second reading voltage may be the reading voltage VRD2. Thus, the first state corresponding to the first reading voltage is state P3, and the second state corresponding to the second reading voltage is state P2. Off-cells with respect to the first reading voltage may refer to memory cells in state P3, which have threshold voltages equal to or greater than the reading voltage VRD3 (the first reading voltage), and off-cells with respect to the second reading voltage may refer to memory cells in state P3 and state P2, which have threshold voltages equal to or greater than the reading voltage VRD2 (the second reading voltage).

Next, in operation S120, the number of off-cells with respect to the first reading voltage (hereinafter referred to as the first off-cell number) and the number of off-cells with respect to the second reading voltage (hereinafter referred to as the second off-cell number) are compared. The first off-cell number and the second off-cell number may be compared directly. Alternatively, the number of memory cells in which a reading error is generated may be calculated with respect to the first and second states based on the first and second off-cell numbers, and then the number of memory cells in which a reading error is generated may be compared. The number of memory cells in which a reading error is generated with respect to the first state refers to the number of memory cells that are programmed in the first state, but are not read as being in the first state. The number of memory cells including a reading error may be calculated by counting the number of off-cells and calculating based on the counted number, without checking a reading error of each of the memory cells through an error check. The number of memory cells in which a reading error is generated with respect to respective states may have the same meaning as a variation in the number of off-cells.

Referring to FIG. 2B, a memory cell in which a reading error is generated with respect to the first state, for example, state P3, and the second state, for example state P2, is a memory cell in section c and a memory cell in section b. As the numbers of memory cells are similar, reading error generation amounts of the first and second states are similar. Accordingly, the number of off-cells with respect to the first reading voltage, for example, the voltage VRD3 (the number of memory cells in state P3), and the number of off-cells with respect to the second reading voltage, for example, the voltage VRD2 (the numbers of memory cells in states P2 and P3), are respectively smaller than predicted numbers of memory cells, and reductions in the numbers may be similar.

However, referring to FIG. 2C, a memory cell in which a reading error is generated is only a memory cell in section d that is programmed in state P3 as a target. Thus, when counting the number of memory cells in state P3 and counting the numbers of memory cells in states P2 and P3, and comparing the numbers with a predicted number of memory cells, the reduction in the number of memory cells in state P3 is relatively large, while the reduction in the numbers of memory cells in states P2 and P3 may be zero or relatively small.

As described above, the number of off-cells with respect to the first reading voltage and the number of off-cells with respect to the second reading voltage are compared in operation S120, and programming error regarding the storage region in which the memory cells are included is determined in operation S130 based on the comparison. As described above, when programming is not normally conducted, that is, when a programming error has occurred, the reduction in the number of off-cells with respect to a predetermined reading voltage is greater than the reduction in the number of off-cells with respect to other reading voltages. Accordingly, an occurrence of a programming error may be determined by comparing the number of off-cells with respect to the first reading voltage and the number of off-cells with respect to the second reading voltage.

Meanwhile, when the number of memory cells including a reading error in the first and second states is calculated based on the first and second numbers of off-cells, and the calculated numbers of memory cells including a reading error are compared, and when reading error generation amounts between the first and second states differ greatly, it may be determined that memory cells have been abnormally programmed. But when the difference between reading error generation is small, it may be determined that the memory cells have been normally programmed. For example, in an embodiment, when a ratio of generated reading errors between the first and second states calculated in operation S120 is greater than a predetermined reference value, it may be determined that memory cells are abnormally programmed, and when the ratio is smaller than the predetermined reference value, it may be determined that memory cells are normally programmed. The reference value may be preset, for example, based on the capacity of the memory cells to be compared.

Referring again to FIG. 2C, the reading error generation amount in state P3 is significantly greater than that of state P2. Thus, it may be determined that memory cells are abnormally programmed using the method of detecting programming errors according to the current embodiment of the inventive concept. However, referring to FIG. 2A, no reading error is generated, and referring to FIG. 2B, reading error generation amounts of states P3 and P2 are similar. Accordingly, it may be determined that memory cells are normally programmed. Accordingly, as illustrated in FIG. 2C, if a sudden power-off has occurred during programming of the memory cells, it may be determined that a programming error is detected. As illustrated in FIGS. 2A and 2C, if programming is normally performed, it may be determined that no programming error is detected.

As described above, according to the exemplary method of operating a memory device, a programming error may be determined by reflecting characteristics of threshold voltage distributions of memory cells that are not normally programmed, thereby increasing the accuracy of programming error detection. Also, instead of determining, for example, whether or not an error bit has been generated, the number of off-cells regarding threshold voltages is simply counted and the occurrence of a programming error is determined using the counted number. Thus, programming error detection may be simplified and a detection speed may be increased.

Conventionally, the available level of Error Check and Correction (ECC) is determined. It is then determined that programming has been performed abnormally when the number of generated error bits (e.g., the number of fail bits) is greater than the available level of ECC, and that programming has been performed normally when the number of generated error bits is equal to or less than the available level of ECC. However, the number of generated reading error bits of abnormal programming may be similar to or equal to or less than the number of generated reading error bits of normal programming. For example, referring to FIGS. 2B and 2C, for memory cells that are normally programmed but deteriorate later, a memory cell in which a reading error occurs corresponds to memory cells included in sections a, b, and c of FIG. 2B, and form memory cells that are abnormally programmed, a memory cell in which a reading error occurs corresponds to a memory cell included in section d of FIG. 2C. Thus, it may be estimated that the number of memory cells included in sections a, b, and c may be similar to or greater than the number of memory cells included in section d. Accordingly, the number of generated reading error bits may be greater in FIG. 2B than in FIG. 2C. If occurrences programming errors are determined based on the absolute number of generated reading error bits simply with respect to the available level of ECC, as is done conventionally, memory cells that are normally programmed and deteriorate later and memory cells that are abnormally programmed may not be distinguishable from each other.

However, according to the method of determining a programming error of the present embodiment, whether a programming error has occurred is determined based on relativity of distribution characteristics of a predetermined state to distribution characteristics of other states. Thus, memory cells that are normally programmed and deteriorate later and memory cells that are abnormally programmed may be distinguishable from each other, and a programming error of the memory cells may be determined accurately.

Figure 3:
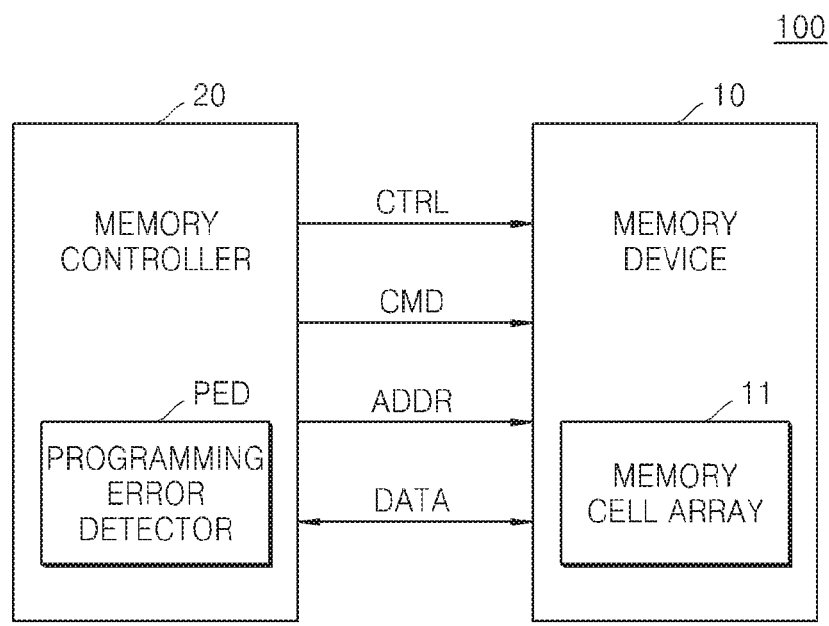
FIG. 3 is a schematic block diagram illustrating a memory system, according to an embodiment of the inventive concept.

FIG. 3 is a schematic block diagram illustrating a memory system 100, according to an embodiment of the inventive concept.

Referring to FIG. 3, the memory system 100 includes a memory device 10 and a memory controller 20. The memory controller 20 is configured to perform control operations with respect to the memory device 10. More particularly, the memory controller 20 may control programming (writing), reading, and erasing of data DATA with respect to the memory device 10 by providing the memory device 10 with an address ADDR, a command CMD, and a control signal CTRL.

In the depicted embodiment, the memory device 10 includes a memory cell array 11. The memory cell array 11 includes memory cells that are arranged in regions where a plurality of word lines and a plurality of bit lines intersect, respectively. According to various embodiments, the memory cells may be flash memory cells, and the memory cell array 11 may be a NAND flash memory cell array or a NOR flash memory cell array, for example. For purposes of illustration, embodiments of the inventive concept will be described hereinafter under the assumption that the memory cells are flash memory cells. However, the embodiments are not limited thereto, and the memory cells may be various other types of memory cells, such as resistive memory cells, including resistance RAM (RRAM), phase change RAM (PRAM) or magnetic RAM (MRAM) memory cells, for example.

When an unexpected event, such as sudden power-off state or a drop in programming voltage, occurs while programming memory cells included in a selected word line in the memory cell array 11 of the memory device 10, the programming operation may not be performed normally. Thus, when the memory device 10 returns to a normal state, it must be determined whether programming operations with respect to memory cells respectively programmed before and after occurrence of the unexpected event have been abnormally performed. That is, it must be detected whether a programming error exists. When a programming error is detected, a compensation operation is additionally performed. To this end, the memory controller 20 includes a programming error detector PED.

The memory controller 20 provides the memory device 10 with addresses of memory cells that are programmed last (after the memory device 10 returns to a normal state), and the memory device 10 may read data DATA from memory cells corresponding to the addresses and provide the data to the memory controller 20. The programming error detector PED may then determine whether there is an error in the programming operation of the memory cells based on the data DATA.

The programming error detector PED may operate according to the method of operating a memory device described with reference to FIG. 1, for example (he method of detecting a programming error). When the programming error detector PED determines that programming has been performed abnormally, that is, when it determines that an error in the programming operation has occurred, the memory controller 20 may treat an area of memory cells where abnormal programming is performed as a bad region, and provide the memory device 10 with a control signal CTRL or a command CMD that allows execution of a compensation operation, such as reprogramming data to the memory cells of another region.

Figure 4:
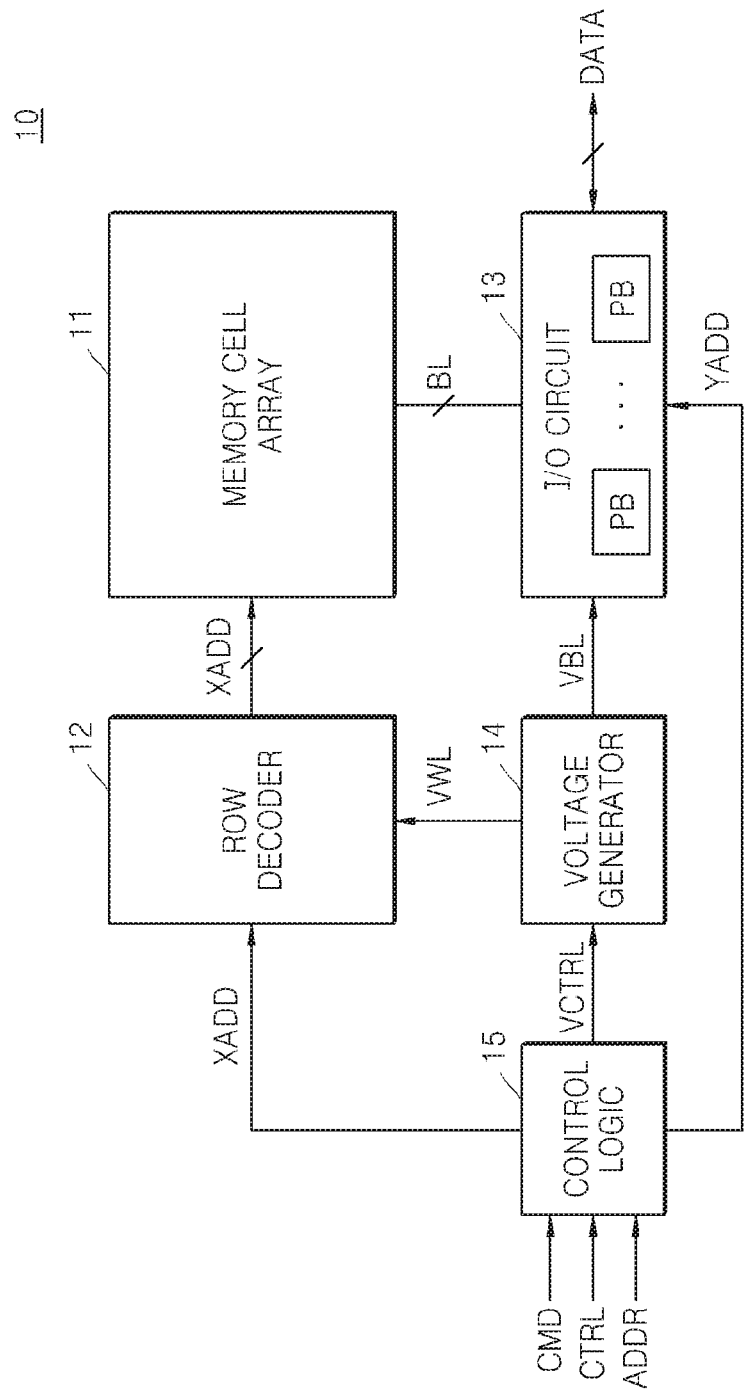
FIG. 4 is a block diagram illustrating a memory device included in the memory system of FIG. 3, according to an embodiment of the inventive concept.

FIG. 4 is a block diagram illustrating a memory device 10 included in the memory system 100 of FIG. 3, according to an embodiment of the inventive concept.

Referring to FIG. 4, the memory device 10 may be a flash memory device, as mentioned above, including memory cell array 11, a row decoder 12, an input/output (I/O) circuit 13, a voltage generator 14, and control logic 15.

The memory cell array 11 includes a plurality of memory cells that are respectively connected to a plurality of word lines WL and a plurality of bit lines BL. As described below with reference to FIGS. 5A and 5B, the memory cells may be NAND flash memory cells arranged in a two-dimensional array structure or a three-dimensional vertical array structure. The memory cells may be multi-level cells and may be programmed using various programming methods, such as a shadow programming method, a reprogramming method, or an on-chip buffer programming method, for example.

The row decoder 12 selects memory cells connected to a selected word line using a method of selecting a word line based on row address XADD. For example, a programming voltage and a verification voltage may be applied to the selected word line in a write mode, and a reading voltage may be applied to the selected word line in a read mode, and an erase voltage may be applied to the selected word line in an erase mode. A voltage VWL applied to the word line is supplied by the voltage generator 14 in response to on voltage control signal VCTRL provided by the control logic 15.

The input/output circuit 13 is connected to a plurality of bit lines BL, and stores write data to be programmed in the memory cell array 11, or stores read data sensed from the memory cell array 11. The input/output circuit 13 may include a plurality of page buffers PB corresponding to the plurality of bit lines BL, and a column decoder that selects a bit line based on column address YADD. Each of the page buffers PB may respectively include a data latch and operate as a write driver or a sense amplifier, according to the operational mode of the memory device 10. The input/output circuit 13 may load write data provided from the outside during a programming operation of the write mode, apply a programming enable voltage or a programming prohibition voltage to a bit line according to the write data, and may sense a voltage of each bit line in a read mode to output read data.

The control logic 15 generates various control signals to control overall operation of the memory device 11, and generates a voltage control signal VCTRL, in particular, to control an operation of the voltage generator 14. According to embodiments of the inventive concept, the control logic 15 may be located inside or outside the memory device 11.

The voltage generator 14 generates a word line voltage VWL and a bit line voltage VBL in response to the voltage control signal VCTRL. The word line voltage VWL provided to the row decoder 12 may include a programming voltage, a reading voltage, an erase voltage or the like, according to the corresponding operational mode. The bit line voltage VBL provided to the input/output circuit 13 may include a programming enable voltage, a programming prohibit voltage, a precharge voltage, or the like.

Figure 5A:
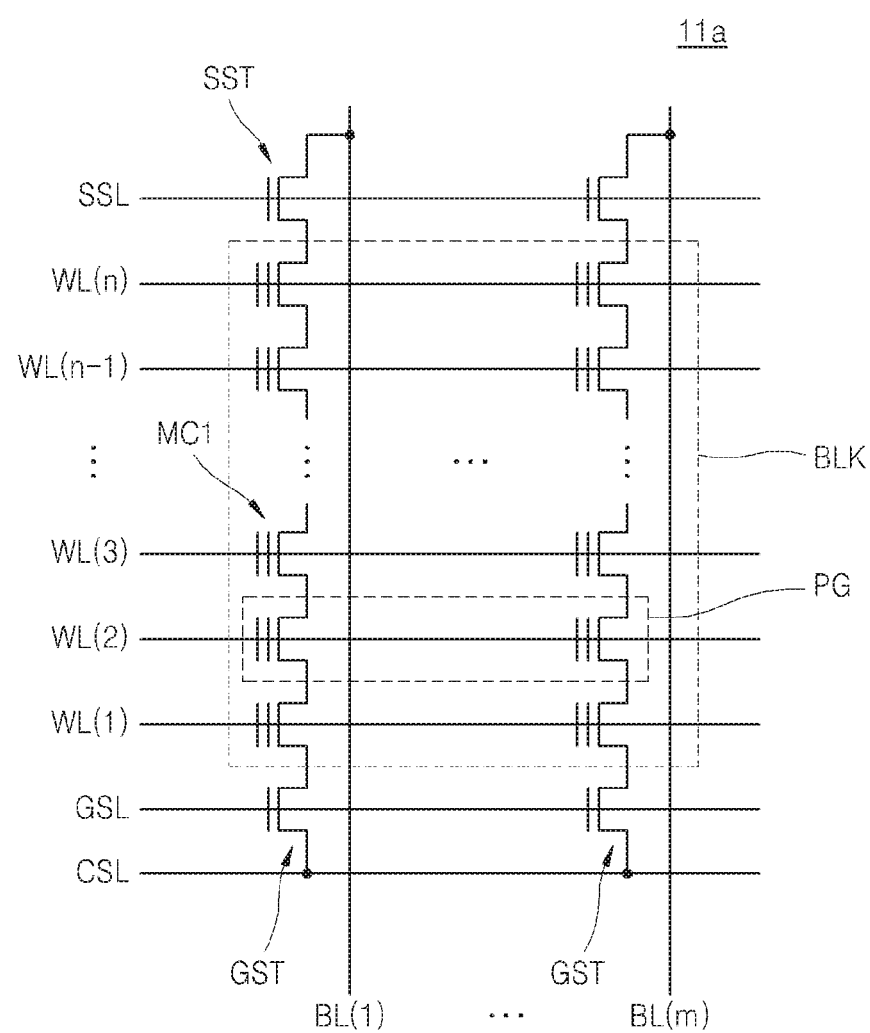
FIGS. 5A and 5B illustrate memory cell arrays included in the memory device of FIG. 3, according to embodiments of the inventive concept.
Figure 5B:
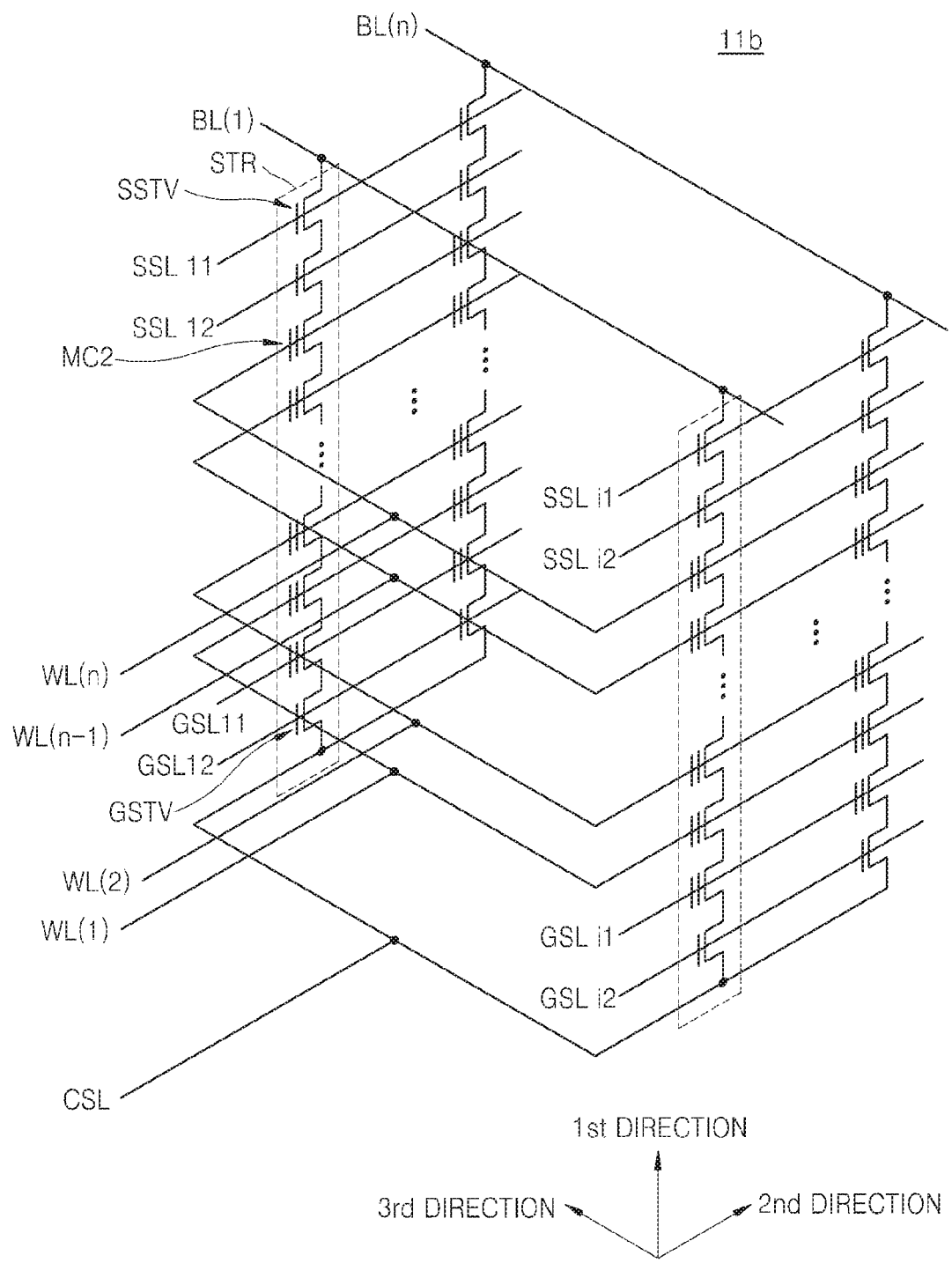

FIGS. 5A and 5B are circuit diagrams illustrating memory cell arrays 11a and 11b included in the memory device 10 of FIG. 2, according to embodiments of the inventive concept.

Referring to FIG. 5A, the memory cell array 11a includes a plurality of bit lines BL(1) through BL(m), a plurality of word lines WL(1) through WL(n), and a plurality of memory cells MC1 arranged in regions where the bit lines BL(1) through BL(m) and the word lines WL(1) through WL(n) intersect. Also, the memory cell array 11a includes a string select transistors SST and ground select transistors GST. The string select transistors SST may be connected to the bit lines BL(1) through BL(m), and the ground select transistors GST may be connected to a common source line CSL. The memory cells MC1 arranged in the same row may be serially arranged between one of the bit lines BL(1) through BL(m) and the common source line CSL, and the memory cells MC1 may be commonly connected to one of the word lines WL(1) through WL(n). That is, the memory cells MC1 may be serially connected between the string select transistors SST and the ground select transistors GST, and multiple (e.g., sixteen, thirty-two or sixty-four) word lines may be arranged between the string select transistors SST and the ground select transistors GST.

The string select transistors SST may be connected to a string select line SSL to be controlled according to a level of a voltage applied through the string select line SSL, and the ground select transistors SST may be connected to a ground select line GSL to be controlled according to a level of a voltage applied through the ground select line GSL. The memory cells MC1 may be controlled according to a level of a voltage applied to the word lines WL(1) through WL(n) to which they are respectively connected. The memory cells MC1 respectively connected to the word lines WL(1) through WL(n) may store data corresponding to a page or multiple pages.

A NAND flash memory device may perform a writing operation (or a programming operation) and a reading operation in units of pages PG, and may perform an erase operation in units of blocks BLK. Information related to a programming operation or an erase operation with respect to each page is stored in a memory cell allocated to a spare region (or a portion of a main region). This information is referred to as flag information FL, and a memory cell that stores flag information is referred to as a flag cell MF.

For a multi-level cell in which N-bit data is stored per cell, a programming operation for each bit may be independently performed up to N times. Also, each programming operation may include multiple programming loops. A programming operation with respect to each bit of a multi-level cell (for example, a least significant bit LSB or a most significant bit MSB) may be performed in cells that are connected to the same word line among the word lines WL(1) through WL(n) in units of pages. A page address allocated during a programming operation may be allocated continuously toward a word line or discontinuously. A page address that is internally allocated may be internally determined in consideration of the number of times that a selected memory cell is used.

Referring to FIG. 5B, the memory cell array 11b includes a plurality of strings STR having a vertical structure. The strings STR may be arranged along a second direction to form a string row, and a plurality of string rows may be arranged along a third direction to form a string array. The strings STR may each include ground select transistors GSTV that are serially arranged in a first direction between the bit lines BL(1) through BL(m) and the common source line CSL, memory cells MC2, and a string select transistor SSTV.

The ground select transistors GSTV may be respectively connected to a plurality of ground select lines GSL11, GSL12, ..., GSLi1, GSLi2, and the string select transistors SSTV may be respectively connected to a plurality of string select lines SSL11, SSL12, ..., SSLi1, SSLi2. The memory cells MC2 arranged in the same layer may be commonly connected to one of the word lines WL(1) through WL(n). The ground select lines GSL11, ..., GSLi2 and the string select lines SSL11, ..., SSLi2 may extend in the second direction and may be arranged in the third direction. The word lines WL(1) through WL(n) may extend in the second direction, and may be arranged in the first direction and the third direction. The bit lines BL(1) through BL(m) may extend in the third direction and may be arranged in the second direction. The memory cells MC2 may be controlled according to a level of a voltage applied to the word lines WL(1) through WL(n).

A vertical type flash memory device including the memory cell array 11b includes NAND flash memory cells. Thus, the vertical type flash memory device also performs a writing operation and a reading operation in units of pages, and performs an erase operation in units of blocks, like a typical NAND flash memory device.

According to embodiments of the inventive concept, two string select transistors included in a string STR may be connected to a string select line, and two ground select transistors included in a string STR may be connected to a ground select line. Also, according to embodiments of the inventive concept, a string may include a string select transistor and a ground select transistor.

Figure 6:
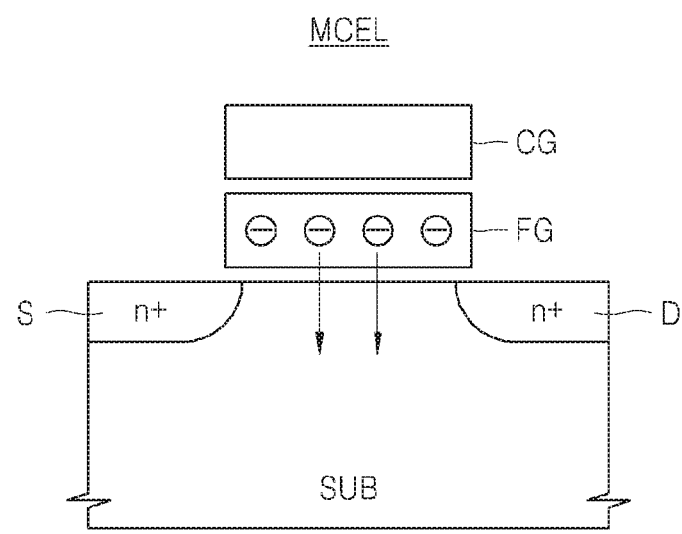
FIG. 6 illustrates examples of memory cells MC1 and MC2 of FIGS. 5A and 5B, according to embodiments of the inventive concept.

FIG. 6 illustrates examples of memory cells MC1 and MC2 of FIGS. 5A and 5B, according to embodiments of the inventive concept.

Referring to FIG. 6, a source S and a drain D are formed on a substrate SUB, and a channel region is formed between the source S and the drain D. A floating gate FG is formed on the channel region, and an insulating layer, such as a tunneling insulating layer, may be disposed between the channel region and the floating gate FG. A control gate CG is formed on the floating gate FG, and an insulating layer, such as a blocking insulating layer, may be disposed between the floating gate FG and the control gate CG. Voltages needed for programming, reading or erasing with respect to the memory cells MCEL may be applied to the substrate SUB, the source S, the drain D, and the control gate CG.

Regarding the flash memory device, data stored in a memory cell MCEL may be read by distinguishing a threshold voltage Vth of the memory cell MCEL. The threshold voltage Vth of the memory cell MCEL may be determined according to the amount of electrons stored in the floating gate FG. In particular, as more electrons are stored in the floating gate FG, the threshold voltage of the memory cell MCEL becomes higher.

Electrons stored in the floating gate FG of the memory cell MCEL may leak in the direction indicated by arrows due to various reasons, and accordingly the threshold voltage of the memory cell MCEL changes is response. For example, electrons stored in the floating gate FG may leak due to abrasion of the memory cell MCEL. In particular, an insulating layer between the channel region and the floating gate FG may be worn away when access operations, such as programming, reading and/or erasing with respect to the memory cell MCEL are repeated, causing electrons stored in the floating gate FG to leak. Also, electrons stored in the floating gate FG may leak due to high-temperature stress or a temperature difference between programming and reading operations. Such leakage may deteriorate the memory device.

Meanwhile, when a programming operation is abnormally performed, electrons stored in the floating gate FG may be less than when a programming operation is normally performed. Accordingly, the threshold voltage of the memory cell MCEL may decrease, and the number of electrons stored in the floating gate FG that are leaked may increase with time.

Figure 7A:
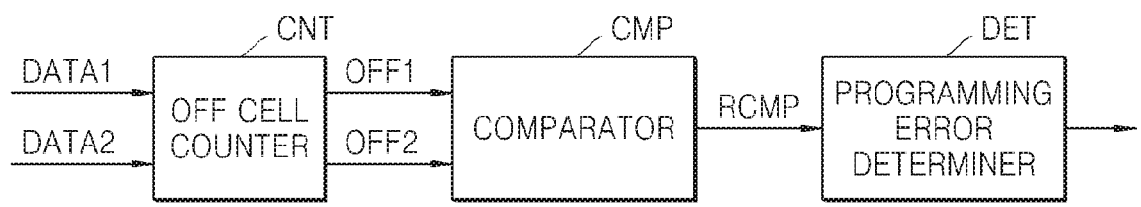
FIG. 7A is a block diagram illustrating a programming error detector included in the memory system of FIG. 3, according to an embodiment of the inventive concept.
Figure 7B:
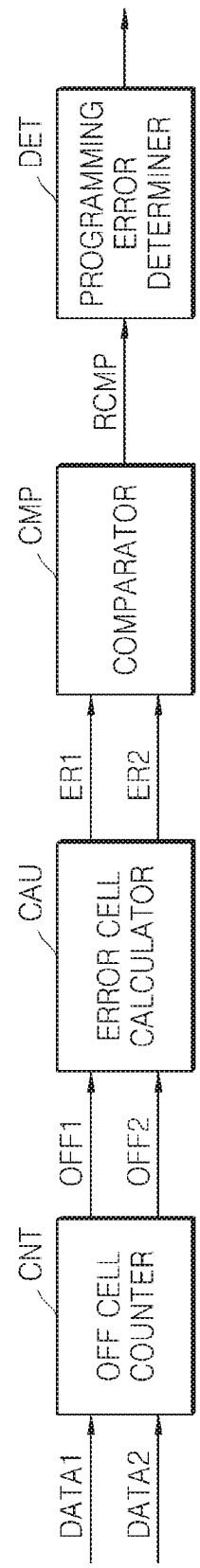
FIG. 7B is a block diagram illustrating a programming error detector included in the memory system of FIG. 3, according to another embodiment of the inventive concept.

FIG. 7A is a block diagram illustrating a programming error detector of the memory system of FIG. 3, according to an embodiment of the inventive concept. FIG. 7B is a block diagram illustrating a programming error detector of the memory system of FIG. 3, according to another embodiment of the inventive concept.

Referring to FIG. 7A, a programming error detector PED includes an off-cell counter CNT, a comparator CMP, and a programming error determiner DET.

The off-cell counter CNT receives first data DATA1 and second data DATA2, and counts the number of off-cells with respect to a first reading voltage and the number of off-cells with respect to a second reading voltage. The first data DATA1 indicates respective states of memory cells read based on the first reading voltage corresponding to a first state, and the second data DATA2 indicates respective states of memory cells read based on the second reading voltage corresponding to a second state. For example, when the first state is state P3 of FIG. 2C, and the second state is state P2 of FIG. 2C, the first data DATA1 may be state information of each of memory cells that are read by reading the memory cells based on a reading voltage VRD3, and the second data DATA2 may be state information of each of memory cells that are read by reading the memory cells based on a reading voltage VRD2. A logic value "1" in the first data DATA1 indicates that a corresponding memory cell is an off-cell with respect to the reading voltage VRD3 (hereinafter referred to as first off-cell), and a logic value "1" in the second data DATA2 indicates that a corresponding memory cell is an off-cell with respect to the reading voltage VRD2 (hereinafter referred to as second off-cell). The off-cell counter CNT may count the number of first off-cells, that is, the number of memory cells read as being in the first state, by counting the number of logic value "1" of the first data DATA1. The counted number may be output as the number of first off-cells OFF1. In addition, by counting the number of logic value "1" of the second data DATA2, the number of the second off-cells, that is, the number of memory cells that are read as being in the first state or the second state, may be counted. The counted number of the second off-cells may be output as the number of second off-cells OFF2.

The comparator CMP compares the number of first off-cells OFF1 and the number of second off-cells OFF2, and outputs a comparison result RCMP. A ratio of the number of second off-cells OFF2 to the number of first off-cells OFF1 may be output as the comparison result RCMP. Alternatively, variations of the number of first off-cells OFF1 and the number of second off-cells OFF2 may be calculated, and a ratio between these variations may be output as the comparison result RCMP. In addition, other various comparison methods may be used.

The programming error determiner DET determines whether a storage region including memory cells includes a programming error based on the comparison result RCMP. The programming error determiner DET may determine that a programming error is present when the comparison result RCMP is either greater or less than a predetermined determination reference value. For example, when the comparison result RCMP regarding a reading error includes the ratio of the number of second off-cells OFF2 to the number of first off-cells OFF1, and the comparison result RCMP is smaller than a predetermined determination reference value, it may be determined that a programming error exists. Alternatively, when the comparison result RCMP regarding a reading error includes a ratio of a variation in the number of second off-cells OFF2 with respect to a variation in the number of first off-cells OFF1, and the comparison result RCMP is greater than a predetermined determination reference value, it may be determined that a programming error exists. That is, when it is determined that programming is abnormally performed, it may be estimated that a condition, such as a sudden power-off state, has occurred during programming of one or more memory cells.

Referring to FIG. 7B, the programming error detector PED includes an off-cell counter CNT, an error cell calculator CAU, a comparator CMP, and a programming error determiner DET. Compared to FIG. 7A, the programming error detector PED includes the error cell calculator CAU as an additional component.

The error cell calculator CAU calculates the number ER1 of first error cells with respect to the first state, and the number ER2 of second error cells with respect to the second state based on the number of first off-cells OFF1 and the number of second off-cells OFF2, respectively, provided by the off-cell counter CNT.

The comparator CMP compares the number ER1 of first error cells with respect to the first state (first error cell number ER1) and the number ER2 of second error cells with respect to the second state (second error cell number ER2). The number of error cells is the same as a variation in the numbers of off-cells, and thus, comparing the numbers of error cells may be the same as comparing the number of off-cells.

Based on the comparison result RCMP, the programming error detector PED determines whether a storage region including memory cells includes a programming error. The programming error determiner DET may determine that a programming error is present when the comparison result RCMP is greater than a predetermined determination reference value, for example.

Figure 8:
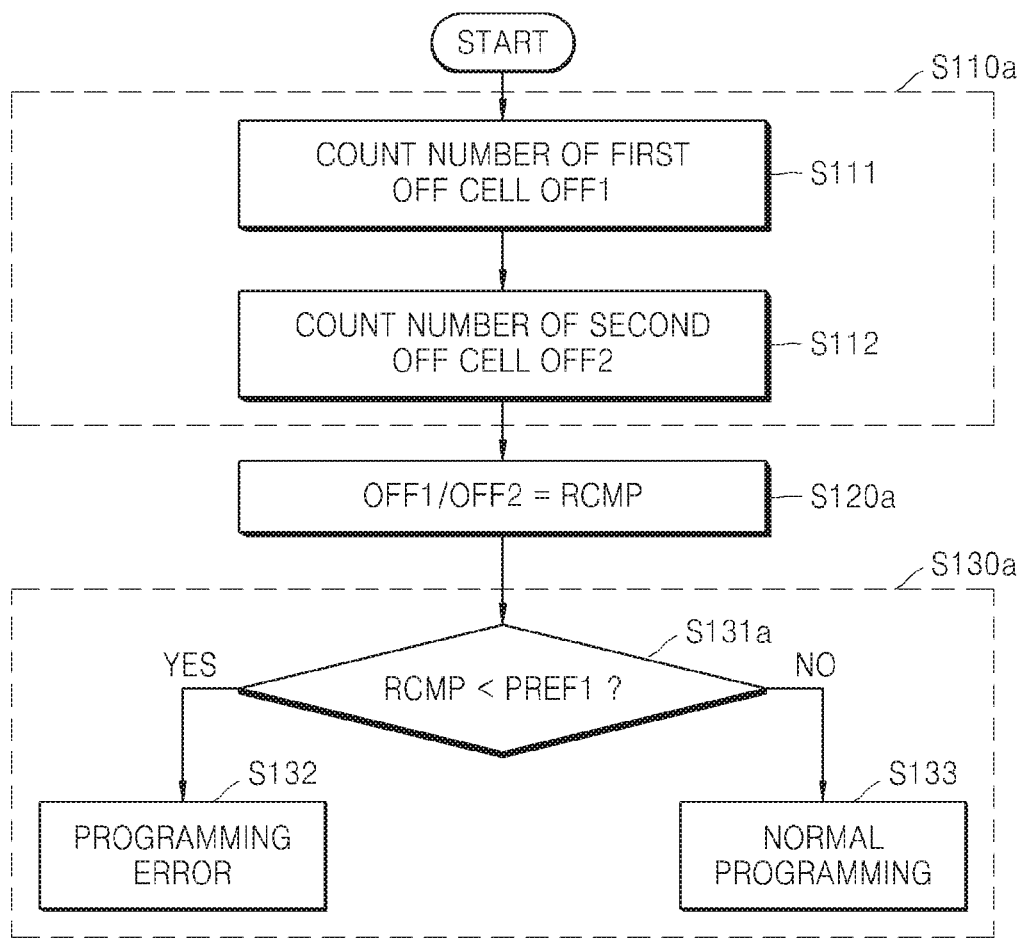
FIG. 8 is a flowchart illustrating a method of operating the memory device of FIG. 1, according to an embodiment of the inventive concept.

FIG. 8 is a flowchart illustrating operation a memory device according to the flowchart of FIG. 1, according to an embodiment of the inventive concept. The flowchart of FIG. 8 shows each operation of the method depicted in FIG. 1 in more detail.

Referring to FIG. 8, the number of first off-cells OFF1 is counted in operation S111, and the number of second off-cells OFF2 is counted in operation S112. As described above, the first off-cells are off-cells with respect to a first reading voltage, and the second off-cells are off-cells with respect to a second reading voltage. When a level of the first reading voltage is higher than that of the second reading voltage, the first off-cells are memory cells in the first state, and the second off-cells are memory cells in the first or second states.

As described above with reference to FIG. 7A, the number of first off-cells OFF1 may be counted based on data obtained by reading states of memory cells with respect to the first reading voltage (DATA1 of FIG. 7A). Also, the number of second off-cells OFF2 may be counted based on data obtained by reading states of memory cells with respect to a second reading voltage (DATA2).

In operation S120a, the number of first off-cells OFF1 and the number of second off-cells OFF2 are compared. According to the depicted embodiment, the comparison result RCMP is calculated as a ratio of the number of first off-cells OFF1 with respect to the number of second off-cells OFF2 (OFF1/OFF2).

Then, in operation S130a, whether there is a programming error is determined based on the comparison result RCMP. According to the depicted embodiment, the comparison result RCMP is compared to a predetermined reference value PREF1 (hereinafter referred to as first determination reference value) in operation S131a. When the comparison result RCMP is less than the first determination reference value PREF1, it is determined in operation S132 that a programming error exists (programming is abnormal). When the comparison result RCMP is greater than or equal to the first determination reference value PREF1, it is determined in operation S133 that programming is normal. The first determination reference value PREF1 may be set in consideration of a capacity of a memory cell to be programmed, a threshold voltage distribution of a programming state, a voltage level of a reading voltage, or a calculation method, for example.

Figure 9:
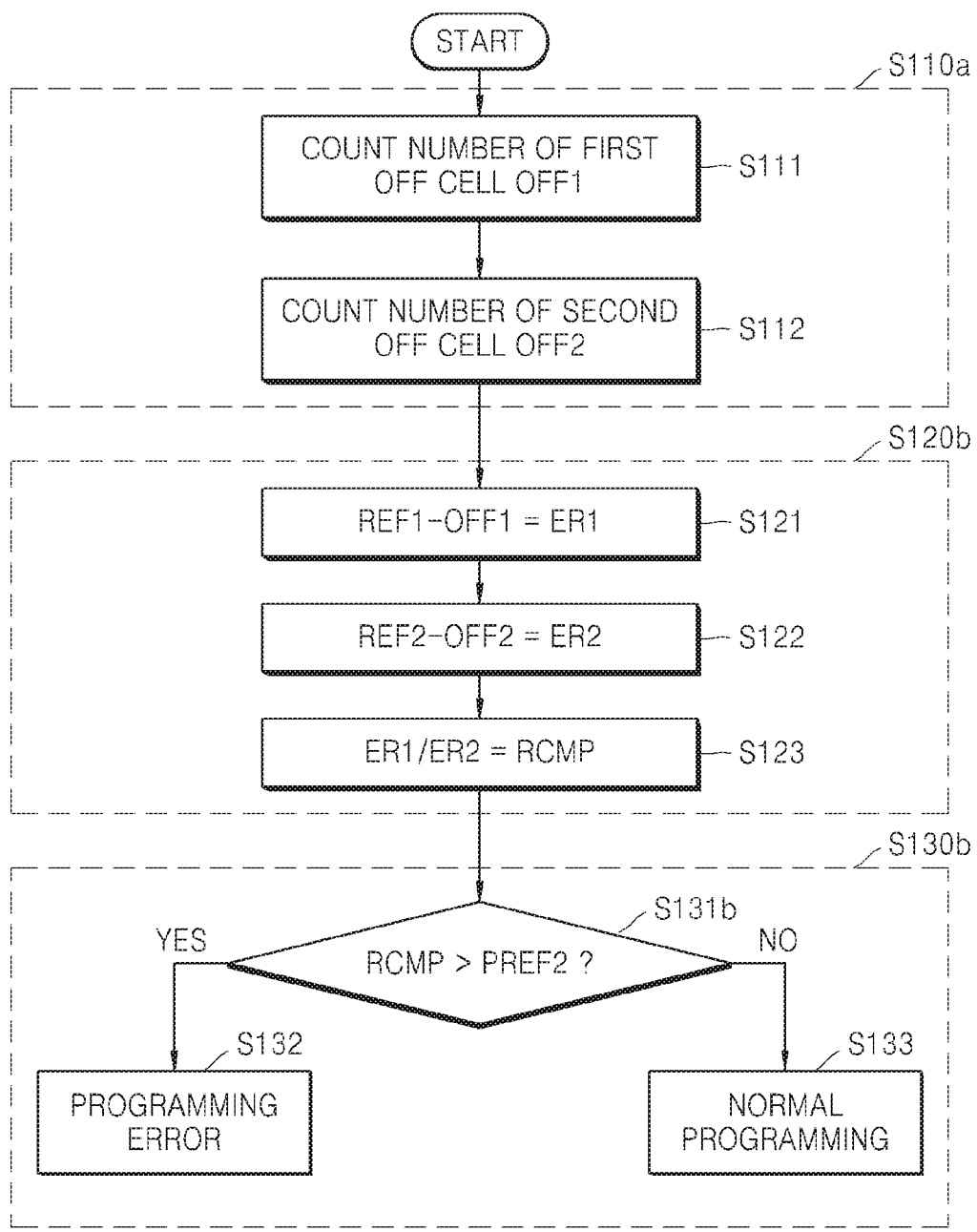
FIG. 9 is a flowchart illustrating a method of operating the memory device of FIG. 1, according to another embodiment of the inventive concept.

FIG. 9 is a flowchart illustrating operation of a memory device according to the flowchart of FIG. 1, according to another embodiment of the inventive concept. The flowchart of FIG. 9 shows each operation of the method depicted in FIG. 1 in more detail.

Referring to FIG. 9, the number of first off-cells OFF1 is counted in operation S111, and the number of second off-cells OFF2 is counted in operation S112, which is the same as in FIG. 8. Thus, the description will not be repeated.

After the number of first off-cells OFF1 and the number of second off-cells OFF2 are counted in operation S110a, the numbers of first off-cells OFF1 and the number of second off-cells OFF2 are compared in operation S120b. According to the depicted embodiment, the number of first off-cells OFF1 and the number of second off-cells OFF2 are not directly compared. Rather, first and second error cell numbers ER1 and ER2, indicating numbers of first and second error cells with respect to the first and second states, respectively, are calculated based on the number of first off-cells OFF1 and the number of second off-cells OFF2. The first and second error cell numbers ER1 and ER2 are compared.

In particular, the number ER1 of first error cells with respect to the first state is calculated in operation S121 by determining the difference between a first reference value REF1 and the number of first off-cells OFF1. The number ER2 of second error cells with respect to the second state is calculated in operation S122 by determining the difference between a second reference value REF2 and the number of second off-cells OFF2. The first reference value REF1 and the second reference value REF2 may be predicted values with respect to the number of first off-cells OFF1 and the number of second off-cells OFF2, respectively. That is, the first reference value REF1 and the second reference value REF2 may be the number of the first off-cells and the number of the second off-cells when programming is normally performed. The numbers ER1 and ER2 of first and second error cells with respect to the first and second states may be the same as variations in the numbers of the first and second off-cells OFF1 and OFF2, respectively.

Next, in operation S123, a ratio between the number ER1 of first error cells with respect to the first state and the number ER2 of second error cells with respect to the second state is calculated as comparison result RCMP (ER1/ER2).

In operation S130b, occurrence of a programming error may be determined by comparing the comparison result RCMP with a predetermined reference value PREF2 (hereinafter referred to as second determination reference value) in operation S131a. When the comparison result RCMP is greater than the second determination reference value PREF2, it is determined in operation S132 that a programming error exists (programming is abnormal). When the comparison result RCMP is less than or equal to the second determination reference value PREF2, it is determined in operation S133 that programming is normal. The second determination reference value PREF2 may be set in consideration of a capacity of a memory cell to be programmed, a threshold voltage distribution of a programming state, a voltage level of a reading voltage, or a calculation method, for example.

Illustrative methods of operating a memory device according to the embodiments of the inventive concept are described above with reference to FIGS. 8 and 9. However, the embodiments are not limited thereto, and other various calculation and/or comparison operations may be used without departing from the scope of the present teachings.

Figure 10:
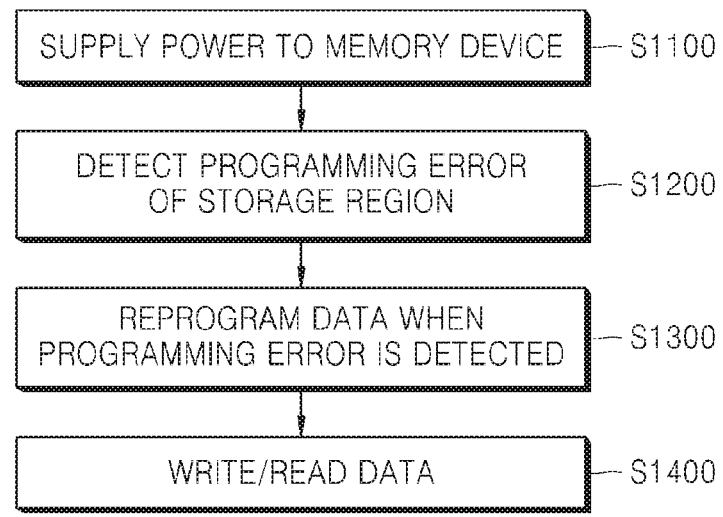
FIG. 10 is a flowchart illustrating a method of operating a memory system, according to an embodiment of the inventive concept.

FIG. 10 is a flowchart illustrating a method of operating a memory system, according to an embodiment of the inventive concept.

Referring to FIG. 10, power is supplied to the memory device in operation S1100. An occurrence of a programming error in a storage region is detected in operation S1200 when the power is supplied. The programming error may be detected by applying a method of detecting a programming error described above with reference to FIGS. 1, 8 and 9. For example, occurrence of a programming error may be determined based on a result of comparing counted numbers of memory cells included in two states from among multiple states in which the memory cells are programmed. The two states may be the highest state and the second highest state from among multiple states to which memory cells are programmed. Alternatively, the two states may be a state in which a memory cell is programmed last and a state in which a memory cell is programmed next to the last state. Also, for example, the storage region may be a storage region that is programmed last before power to the memory device is interrupted.

When a programming error is detected, programmed data is reprogrammed in operation S1300. For example, when a programming error is detected, it may be determined that a sudden power-off state occurred while programming the storage region that was last programmed. When the storage region is abnormally programmed, a reading error generation ratio is high and deterioration may occur quickly, and thus a programming error may be difficult to correct, even using an error correction method, such as ECC. Accordingly, the programmed data is reprogrammed to stably store the data. A storage region where the data is reprogrammed may be different from the storage region that was last programmed. After reprogramming data in operation S1300, the storage region may be treated as a fail region.

As described above, when a programming error is detected, after performing a compensation operation, a typical write/read operation of data may be performed in operation S1400.

Figure 11:
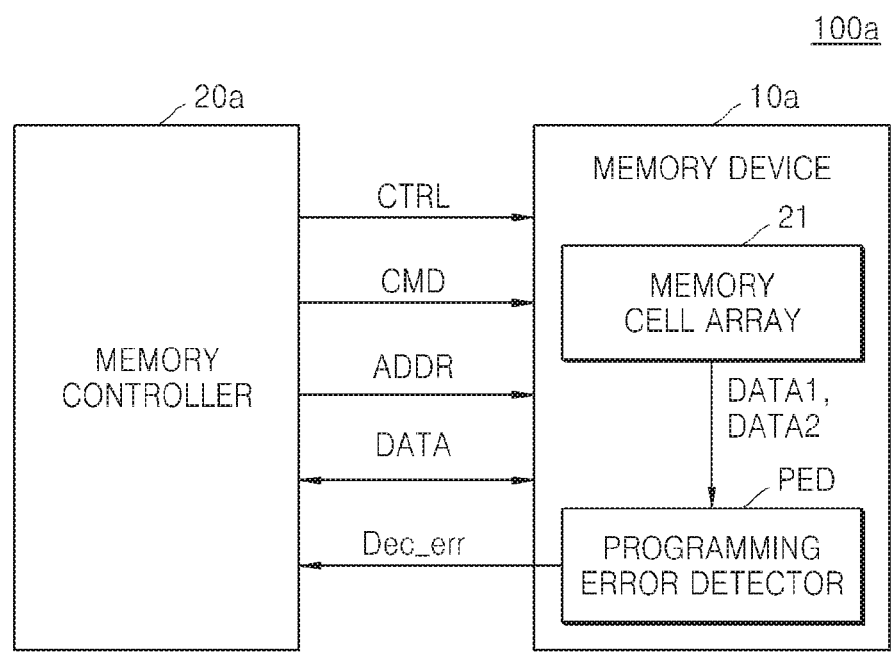
FIG. 11 is a block diagram illustrating a memory system, according to another embodiment of the inventive concept.

FIG. 11 is a schematic block diagram illustrating a memory system 100a, according to another embodiment of the inventive concept.

Referring to FIG. 11, the memory system 100a includes a memory device 10a and a memory controller 20a. The memory device 10a and the memory controller 20a operate in a similar manner as the memory device 10 and the memory controller 20 described above with reference to FIG. 3. The difference is that the programming error detector PED is located in the memory device 10a of the memory system 100a (as opposed to the memory controller 20). That is, the memory device 10a may include an on-chip controller, enabling the programming error detector PED to be included in the memory device 10a.

The programming error detector PED may operate in substantially the same manner as the programming error detector PED of FIG. 3. When the memory controller 20a provides the memory device 10a with an address of memory cells that are accessed last and programmed, and the memory device 10a reads data DATA from the memory cells corresponding to the address, the programming error detector PED receives first data DATA1 corresponding to a first state and second data DATA2 corresponding to a second state, and may detect occurrence of a programming error based on methods of detecting a programming error described above with reference to FIGS. 1, 8, and 9. When a programming error is detected, a programming error detection signal Dec_err is provided by the programming error detector PED to the memory controller 20a. In response to the programming error detection signal Dec_err, the memory controller 20a may treat the region of a memory cell in which programming is abnormally performed as a bad region, and may transmit a control signal CTRL and a command CMD to the memory device 10 to perform a compensation operation, such as reprogramming of a memory cell of another region.

Figure 12:
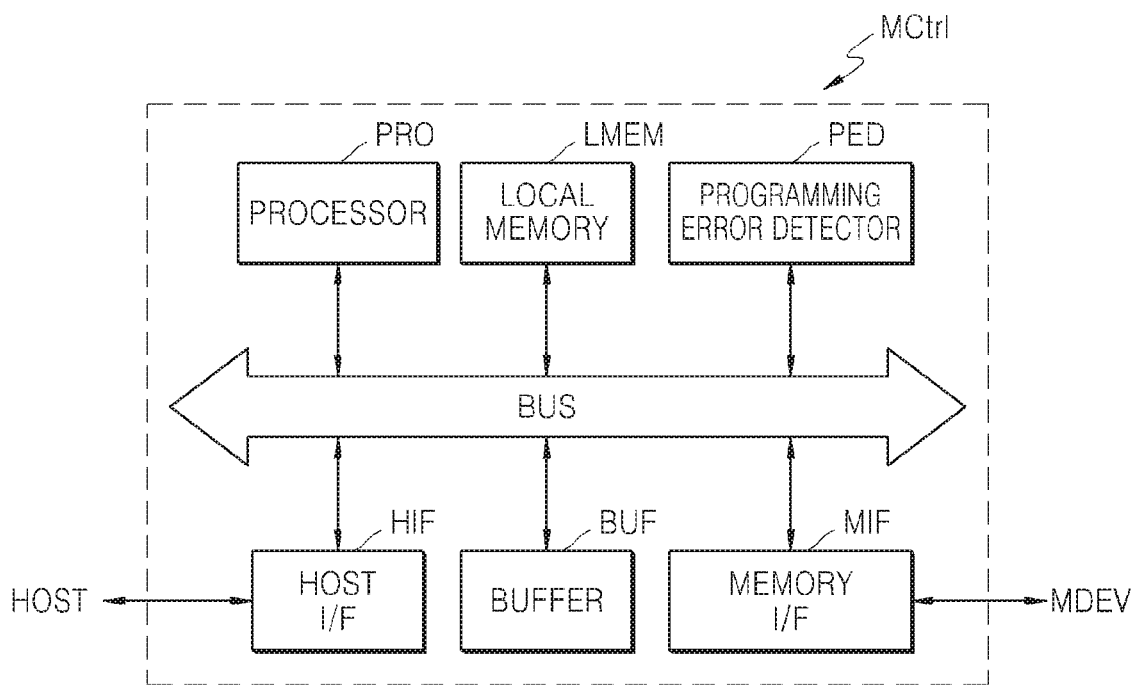
FIG. 12 is a block diagram illustrating a memory controller, according to an embodiment of the inventive concept.

FIG. 12 is a block diagram illustrating a memory controller, according to an embodiment of the inventive concept.

Referring to FIG. 12, memory controller MCtrl includes a host interface unit HIF, a memory interface unit MIF, a local memory LMEM, a buffer BUF, a processor PRO, and a programming error detector PEC, which may be connected via a bus.

The host interface unit HIF provides an interface with respect to an external host device HOST. For example, the host interface unit HIF may operate according to a variety of interface protocols, such as Serial Advanced Technology Attachment (SATA) or Serial Attached SCSI (SAS), but is not limited thereto. For example, the host interface unit HIF may include various other interface protocols, such as Universal Serial Bus (USB), Man Machine Communication (MMC), Peripheral Component Interconnect-Express (PCI-E), Parallel Advanced Technology Attachment (PATA), Small Computer System Interface (SCSI), Enhanced Small Device Interface (ESDI), or Intelligent Drive Electronics (IDE).

The memory interface unit MIF provides an interface with a memory device MDEV to program or read data to or from the memory device MDEV in response to a request by the host device HOST. For example, the memory interface unit MIF may provide a result of converting a logical block address transmitted by the host device HOST to a physical address regarding a page of the memory device MDEV to the memory device MDEV.

The buffer BUF is used to facilitate data transmission between the host device HOST and the memory device MDEV. For example, the buffer BUF may temporarily store data to be programmed to the memory device MDEV according to a request by the host device HOST. Alternatively, the buffer BUF may temporarily data that is read from the memory device MDEV according to a request by the host device HOST. The buffer BUF may be implemented by volatile memory, such as dynamic random access memory (RAM) (DRAM) or static RAM (SRAM), or non-volatile memory, such as magnetic RAM (MRAM), phase-change RAM (PRAM), ferroelectric RAM (FRAM) or flash memory.

Data and a control module or a control program that are used for the memory controller MCtrl to process request of the host device HOST in the memory device MDEV, may be stored in the local memory LMEM. For example, firmware may be stored in the local memory LMEM. Generally, firmware is software in the form of hardware, which includes a command and data to derive the memory system MSYS in a predetermined storage unit, and perform at least one process, such as machine code processing, regarding a request of a host device, data transmission, list processing, floating point operation, or channel control, in order to perform requests by the host device HOST with respect to the memory system MSYS. In addition, the local memory LMEM may store, for example, a mapping table that is referred to in an operational system or address mapping. Like the buffer BUF, the local memory LMEM may be formed of volatile memory, such as DRAM or SRAM, or non-volatile memory, such as MRAM, PRAM, FRAM or flash memory. However, a local memory LMEM that operates as firmware may be a non-volatile memory. The local memory LMEM may be at least one of a homogeneous memory or heterogeneous memory.

The processor PRO is configured to control operations of each element of the memory controller MCtrl. The processor PRO may interpret or execute a control module or a control program that is stored or loaded in the local memory LMEM, thereby processing a request from the host device HOST.

The programming error detector PED may count the number of off-cells with respect to a first reading voltage and off-cells with respect to a second reading voltage based on data read from the memory device MDEV, and may compare the counted numbers values to detect programming errors. When a programming error is detected, it is determined that a programming operation performed with respect to memory cells has not been normally performed. Accordingly, the memory controller MCtrl may control the memory device MDEV to reprogram the affected data.

Figure 13:
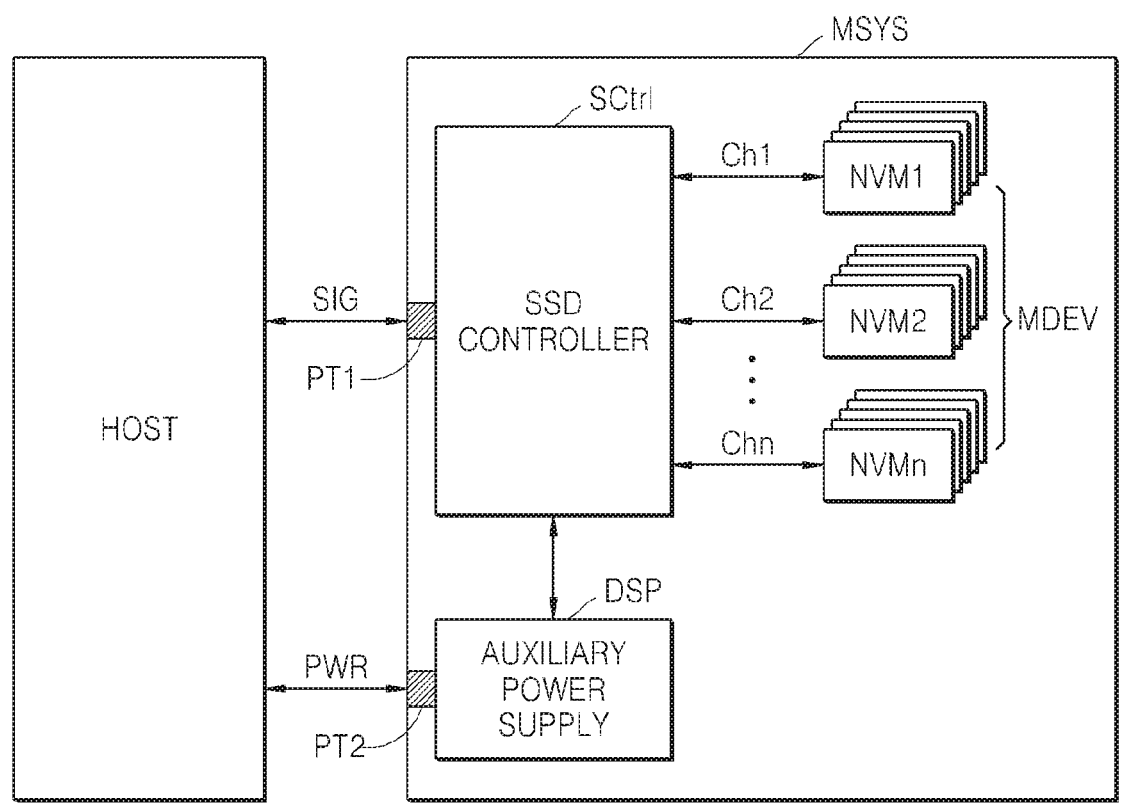
FIG. 13 is a block diagram illustrating a memory system, according to embodiments of the inventive concept, including a solid state drive (SSD)

When the memory system 100 of FIG. 3 and/or the memory system 100a of FIG. 11, according to various embodiments, include a solid state drive (SSD) or are in an SSD, the memory controller MCtrl of FIG. 12 may be included in an SSD controller SCtrl of FIG. 13, for example.

FIG. 13 is a block diagram illustrating a memory system, according to embodiments of the inventive concept, applied to an SSD.

Referring to FIG. 13, SSD MSYS includes an SSD controller SCtrl and a memory device MDEV. The SSD controller SCtrl controls the memory device MDEV in response to signals SIG received from the host device HOST via a first port PT1 of the SSD MSYS. The SSD controller SCtrl may be connected to the memory device MDEV through multiple channels Ch1 through Chn. The memory device MDEV may include multiple non-volatile memories NVM1 through NVMn. The non-volatile memories NVM1 through NVMn may be flash memories MEM, for example, according to embodiments described above. However, the memory device MDEV is not limited thereto, and may include other flash memories or other non-volatile memories.

The SSD MSYS may further include an auxiliary power supply DSP to receive power PWR from a host device HOST through a second port PT2. However, embodiments of the inventive concept are not limited thereto, and the SSD MSYS may receive power from an external device other than the host device HOST.

The SSD MSYS outputs result of processing requests from of the host device HOST through the first port PT1.

Figure 14:
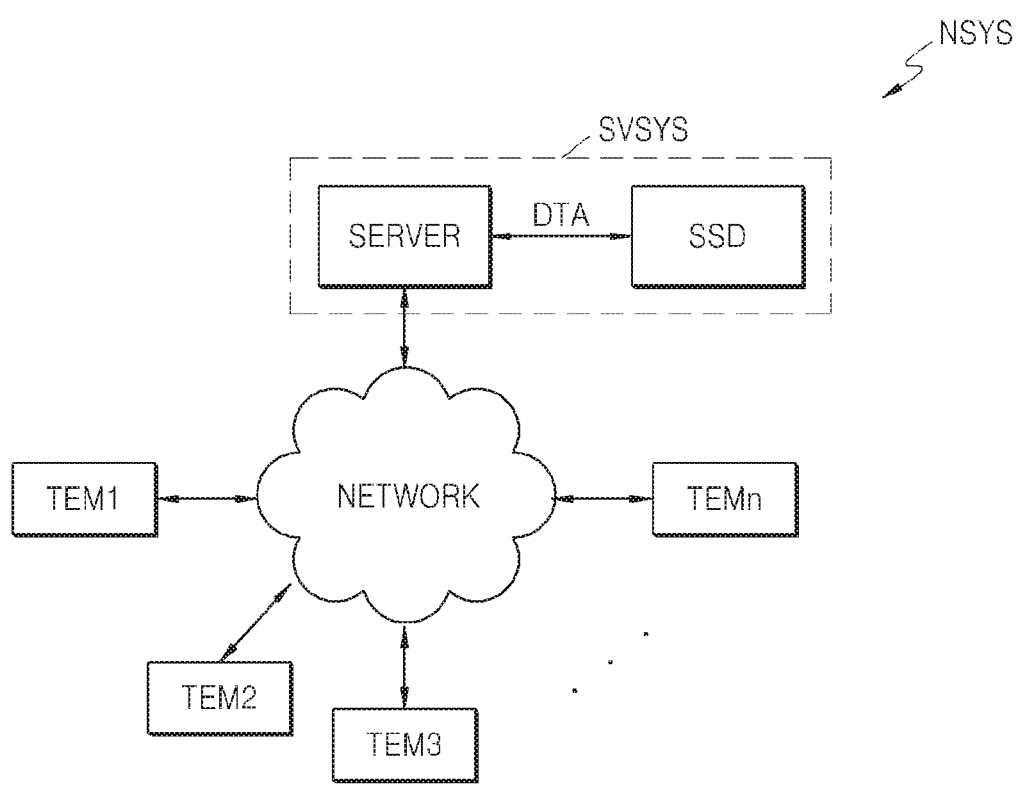
FIG. 14 is a block diagram illustrating a server system and a network system including the SSD of FIG. 13, according to embodiments of the inventive concept.

FIG. 14 is a block diagram illustrating a server system SVSYS and a network system NSYS including the SSD of FIG. 13, according to embodiments of the inventive concept.

Referring to FIG. 14, the network system NSYS includes the server system SVSYS and multiple terminals TEM1 through TEMn that are connected through a Network. The server system SVSYS includes a server SERVER that processes requests received through one or more of the terminals TEM1 through TEMn connected to the Network and an SSD that stores data DTA corresponding to the requests received by the terminals TEM1 through TEMn. The SSD of FIG. 14 may be the SSD of FIG. 13, for example.

Figure 15:
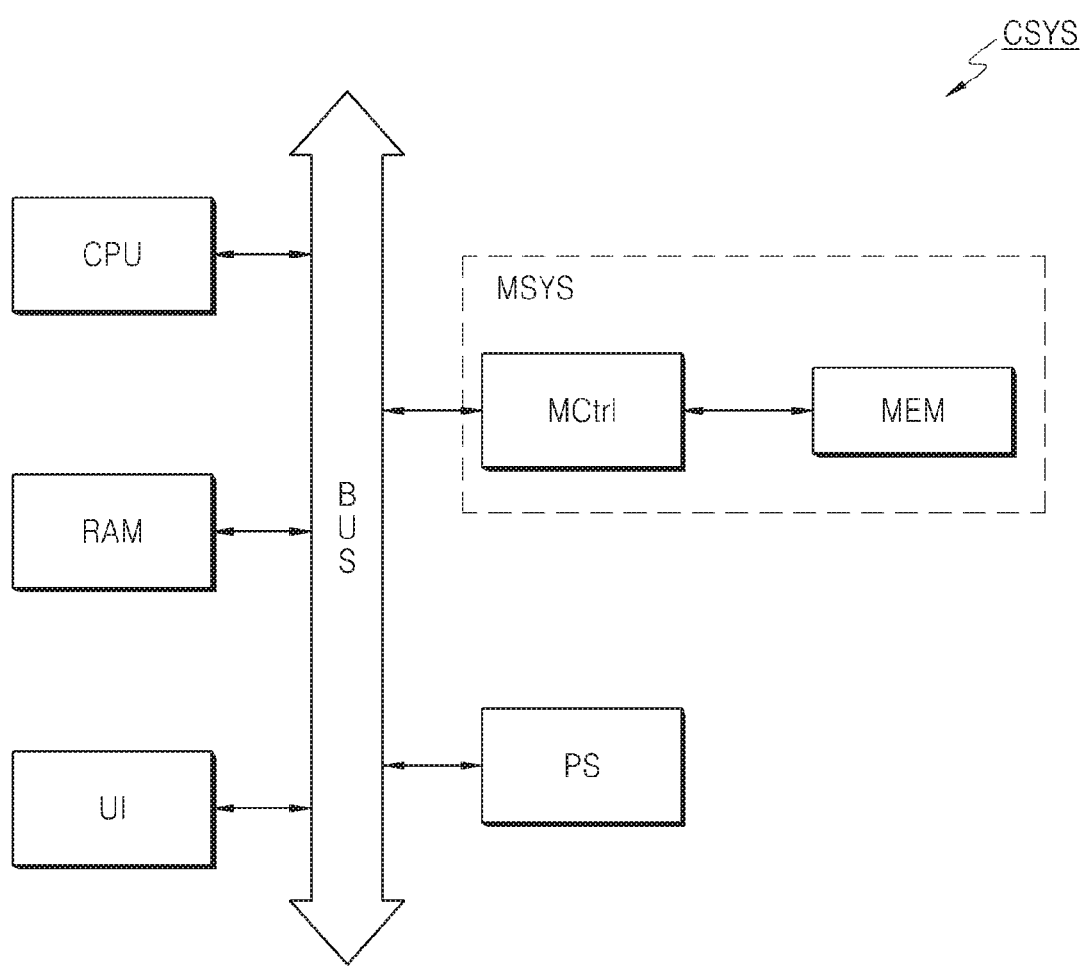
FIG. 15 is a block diagram illustrating a computer device including a memory system, according to embodiments of the inventive concept.

FIG. 15 is a block diagram illustrating a computer device including a memory system CSYS, according to the embodiments of the inventive concept.

Referring to FIG. 15, the computer system CSYS includes a central processing unit CPU, a user interface UI, and a memory system MSYS that are electrically connected to a bus. The memory system MSYS may be the memory system 100 of FIG. 3 or the memory system 100a of FIG. 11, for example, according to various embodiments. The computer system CSYS may further include a power supply device PS. Also, the computer system CSYS may further include a volatile memory device (e.g., RAM) for data transmission and reception between the central processing unit CPU and the memory system MSYS.

If the computer system CSYS is a mobile device, a battery for supplying operational voltage of the computer system CSYS and a modem, such as a baseband chipset, may be also included. In addition, as would be apparent to one of ordinary skill in the art, an application chipset, a camera image processor (CIS), a mobile DRAM, or the like may be further included in the computer system CSYS of the present embodiment.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a memory device including at least one storage region, the storage region including a plurality of memory cells, and each of the plurality of memory cells being programmed into a state among at least four states, the method comprising:

counting, among the plurality of memory cells in the storage region, a first number of off-cells in a first group of memory cells with respect to a first reading voltage and a second number of off-cells in a second group of memory cells with respect to a second reading voltage;

comparing the first number with the second number; and determining, based on a result of the comparing, whether a programming error exists in the storage region in which the plurality of memory cells are included, wherein the first group of memory cells has been programmed for a highest state among the at least four states and the second group of memory cells has been programmed for a second highest state among the at least four states.

2. The method of claim 1, wherein it is determined that the programming error exists when the first number is substantially greater than the second number.

3. The method of claim 1, wherein a voltage level of the first reading voltage is higher than a voltage level of the second reading voltage.

4. The method of claim 1, wherein the first reading voltage corresponds to a minimum voltage level of the highest state.

5. The method of claim 4, wherein the second reading voltage corresponds to a minimum voltage level of the second highest state.

6. The method of claim 1, wherein the second group of memory cells for the second highest state is programmed before programming the first group of memory cells for the highest state.

7. The method of claim 1, further comprising a step of reprogramming the plurality of memory cells when it is determined that the programming error exists.

8. The method of claim 1, wherein the comparing the first number with the second number comprises calculating a ratio of the first number and the second number.

9. The method of claim 1, wherein the programming error exists when a sudden power-off has occurred during programming the plurality of memory cells.

10. The method of claim 1, wherein each of the plurality of memory cells includes at least two-bit data.

11. A method of operating a memory device including at least one storage region, the storage region including a plurality of memory cells, and each of the plurality of memory cells being programmed into a state among at least four states, the method comprising:

counting, among the plurality of memory cells in the storage region, a first number of off-cells in a first group of memory cells with respect to a first reading voltage and a second number of off-cells in a second group of memory cells with respect to a second reading voltage;

comparing the first number with the second number; and determining, based on a result of the comparing, whether a programming error exists in the storage region in which the plurality of memory cells are included, wherein the first group of memory cells has been programmed for a first state which is a highest state among the at least four states and the second group of memory cells has been programmed for a second state among the at least four states, and the second state is different from the first state.

12. The method of claim 11, wherein it is determined that the programming error exists when the first number is greater than the second number.

13. The method of claim 11, wherein a voltage level of the first reading voltage is higher than a voltage level of the second reading voltage.

14. The method of claim 11, wherein the first reading voltage corresponds to a minimum voltage level of the first state.

15. The method of claim 14, wherein the second reading voltage corresponds to a minimum voltage level of the second state.

16. The method of claim 11, wherein the second group of memory cells for the second state are programmed before programming the first group of memory cells for the first state.

17. The method of claim 11, further comprising a step of reprogramming the plurality of memory cells when it is determined that the programming error exists.

18. The method of claim 11, wherein the comparing the first number with the second number comprises calculating a ratio of the first number and the second number.

19. The method of claim 11, wherein the programming error exists when a sudden power-off has occurred during programming the plurality of memory cells.

20. The method of claim 11, wherein each of the plurality of memory cells includes at least two-bit data.

* * * * *